United States Patent
Zhang et al.

(10) Patent No.: US 8,976,053 B1
(45) Date of Patent: Mar. 10, 2015

(54) METHOD AND APPARATUS FOR VERNIER RING TIME TO DIGITAL CONVERTER WITH SELF-DELAY RATIO CALIBRATION

(71) Applicant: Amlogic Co., Ltd., Santa Clara, CA (US)

(72) Inventors: Weicheng Zhang, Shanghai (CN); Ming Shi, Shanghai (CN); Wei-Hua Zou, Shanghai (CN); Shu-Sun Yu, Cupertino, CA (US); Chieh-Yuan Chao, Fremont, CA (US)

(73) Assignee: Amlogic Co., Ltd., Santa Clara, CA (US)

( * ) Notice: Subject to any disclaimer, the term of this patent is extended or adjusted under 35 U.S.C. 154(b) by 1 day.

(21) Appl. No.: 14/046,874

(22) Filed: Oct. 4, 2013

(51) Int. Cl.
*H03M 1/12* (2006.01)
*H03M 1/00* (2006.01)
*H03M 1/06* (2006.01)
*H03M 1/36* (2006.01)

(52) U.S. Cl.
CPC . *H03M 1/12* (2013.01); *H03M 1/00* (2013.01); *H03M 1/0695* (2013.01); *H03M 1/365* (2013.01)

USPC .......................................... 341/155; 341/156

(58) Field of Classification Search
CPC ....... H03M 1/12; H03M 1/00; H03M 1/0695; H03M 1/365
USPC .......... 341/155, 156, 166, 120; 327/159, 161, 327/158, 142

See application file for complete search history.

(56) References Cited

U.S. PATENT DOCUMENTS

2014/0320324 A1* 10/2014 Canard et al. ................. 341/131

* cited by examiner

*Primary Examiner* — Joseph Lauture
(74) *Attorney, Agent, or Firm* — Venture Pacific Law, PC

(57) ABSTRACT

Some embodiments of the present invention provide a method and apparatus for a Vernier ring time to digital converter having a single clock input and an all digital circuit that calculates a fixed delay relationship between a set of slow buffers and fast buffers. A method for calibrating a Vernier Delay Line of a TDC, comprising the steps of inputting a reference clock to a slow buffer and to a fast buffer, determining a delay ratio of the slow buffer and fast buffer; and adjusting the delay ratio of the slow buffer and fast buffer to a fixed delay ratio value wherein an up-down accumulator generates control signals to adjust the slow buffer.

10 Claims, 3 Drawing Sheets

METHOD AND APPARATUS FOR VERNIER RING TIME TO DIGITAL CONVERTER WITH SELF-DELAY RATIO CALIBRATION

FIELD OF INVENTION

This invention relates to Vernier time to digital convertors, and in particular, to an automatic delay adjustment for a fixed ratio delay between slow buffers and fast buffers.

BACKGROUND

In electronic instrumentation and signal processing, a time to digital converter (TDC) is a device that recognizes events and provides a digital representation of the time when an event occurred. A TDC can output a time of arrival for an incoming pulse. Some applications of TDC may measure the time interval between two events rather than some specific event in absolute time. Two delay lines are usually used to measure the fine interval between the rising edges of the start and stop signals. The simplest arrangement is a tapped delay line with one D flip-flop (DFF) connected to each tap. In this case, the resolution is the propagation delay of a single delay buffer. Higher resolution can be obtained by utilizing a Vernier delay line (VDL) using two delay buffer chains. Timing resolution is determined by the difference between two propagation delay values.

Typically, Vernier time to digital conversion circuits utilize an additional delay line disposed along the propagation path of the reference clock for sampling the input signal. The delay line for the reference clock reacts faster than the delay line for the input signal. Thus, in a Vernier time to digital converter, the input signal travels through a slower delay path and is sampled by a reference clock signal that travels through a faster delay path. By shifting the rising edge of the reference clock signal due to the faster delay path, improved phase quantization can be obtained compared to traditional time to digital converters. The phase quantization is proportional to the difference in the delays between the two delay lines. Maintaining a consistent designed difference in the delays of the two delays lines is critical to proper and accurate operation.

Although more accurate for TDC, drawbacks with the use of TDC based on Vernier delay technique include complexity of the circuitry and the effect of variations in process voltage and temperature (PVT). Therefore, it is desirable to provide new methods and apparatuses for a Vernier delay line TDC that can automatically adjust delay to achieve a fixed ratio delay time between slow buffers and fast buffers of a system independent of PVT and has less complexity than previous Vernier time to digital convertors.

SUMMARY OF THE INVENTION

Process voltage and temperature (PVT) variation during manufacturing of an integrated circuit typically requires calibration of fast buffers and slow buffers for consistent and accurate propagation delay performance. Methods and apparatuses for a Vernier ring time to digital converter (VRTDC) with self-delay calibration for a fixed ratio delay time between slow buffer and fast buffer are disclosed. The novel self-delay calibration Vernier delay TDC apparatus comprises a voltage controlled slow buffer chain having an input coupled to a reference clock and an output coupled to a first input of a bang-bang phase detector ("BBPD") configured to provide a slow buffer delay signal. A fast buffer chain having an input is coupled to the reference clock and an output is coupled to a second input of the BBPD configured to provide a fast buffer delay signal. The BBPD is configured to provide a polarity signal based upon a phase difference between the slow buffer delay signal and the fast buffer delay signal. An accumulator has a first input coupled to a reference value, a second input coupled to the BBPD configured to receive the polarity signal, an output coupled to the voltage controlled slow buffer chain, and a clock input coupled to the reference clock wherein the accumulator responsive to the polarity signal from the BBPD is configured to provide a delay control signal to the voltage controlled slow buffer chain to change propagation delay of the slow buffer delay signal.

In accordance to another embodiment of the present invention, a locking detector has a clock input coupled to the reference clock and an input coupled to an output of the BBPD configured to receive the polarity signal and provide a calibration done signal based upon a plurality of consecutive positive and negative polarity signals.

In accordance to another embodiment of the present invention, the calibration done signal indicates a fixed ratio delay between the slow buffer chain and the fast buffer chain is achieved.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

The present invention provides an automated delay adjustment for Vernier ring time to digital converter (VRTDC) that overcome short comings of previous time to digital converters based on a Vernier ring. The present VRTDC provides a single clock input and an all digital circuit that calculates a fixed delay relationship between a set of slow buffers and fast buffers. By using a single clock input and digital circuitry without analog conversions, much complexity and cost associated with VRTDC are substantially reduced compared with previous implementations.

Variations in process voltage temperature (PVT) during fabrication are taken into account by adjusting delay of either the slow or fast buffers in order to calibrate the slow buffers 102 to have a fixed delay relationship with the fast buffers 104. The automated delay adjustment for the VRTDC provides two sets of buffers: a chain of slow buffers and a chain of fast buffers. Although other ratio combinations of slow buffers to fast buffers may be used, in accordance to an embodiment of the present invention, the slow buffer to fast buffer ratio is two. In other words, there are four slow buffers and eight fast buffers.

Figure 1:
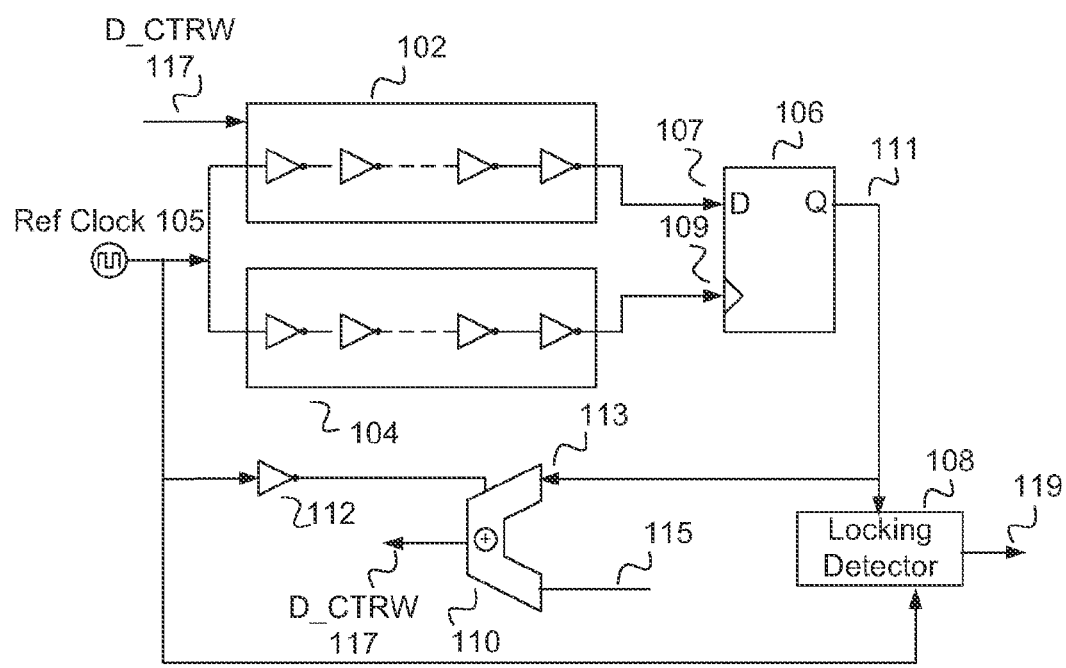
FIG. 1 illustrates a block diagram of a Vernier ring time to digital converter (VRTDC) in accordance to an embodiment of the present invention.

FIG. 1 illustrates a block diagram of a Vernier ring time to digital converter (VRTDC) in accordance to an embodiment of the present invention. Slow buffers 102 and fast buffers 104 are coupled in parallel to an input reference clock 105. The slow buffers 102 include a chain of slow buffers and the fast buffer 104 includes a chain of fast buffers. The output of slow buffers 102 is coupled to a data input 107 of a bang-bang phase detector ("BBPD") 106. A BBPD is a device that detects early or late relationship between the output rising clock edges of the chain of slow buffers 102 and the chain of fast buffers 104. A simplified BBPD may be implemented with a single D flip-flop. The output of fast buffers 104 is coupled to a trigger or clock input 109 of the BBPD 106. An output 111 from the BBPD is coupled to a locking detector 108 and a first input 113 of an up-down accumulator 110 to denote the polarity (or sign) of the accumulated value. A second input 115 of the up-down accumulator 110 is set to a value. The value can be 1, 2 . . . , but should be a positive one. Combined with the 110 polarity signal, the accumulated value can be "±1, ±2 . . . ". Although other values may be used, the present embodiment sets the value at "1". The locking detector 108 provides a calibration done signal 119 when a fixed delay relationship between the slow buffers 102 and the fast buffers 104 has been achieved. The fixed delay relationship is user selectable. In accordance to an embodiment of the present invention, there are 14 slow buffers and 14 fast buffers that are each selectable to include in the chain of slow buffers 102 and in the chain of fast buffers 104. Many fixed ratio combinations between slow buffers 102 and fast buffers 104 can be selected from the combination of 14 slow buffers and 14 fast buffers, e.g. one to two ratio (1:2) of slow buffers to fast buffers or seven to eight ratio (7:8) of slow buffers to fast buffers. In accordance to an embodiment of the present invention, a two to one ratio (2:1) of fast buffers and slow buffers is selected. The locking detector 108 has an input coupled to the reference clock 105. In operation, the output signal 111 of either logic "1" or "0" from BBPD 106 is applied to input 113 of the up-down accumulator 110. If the output signal 111 is a logic "1", the up-down accumulator 110 adds the value (−1) that is applied to the second input 115 at each reference clock period. If the output signal 111 is a logic 0, the up-down accumulator 110 subtracts the value (−1) that is applied to the second input 115 at each reference clock period. For example, if the output of the BBPD 106 is a logic "1", the up-down accumulator 110 adds the value "−1" at each reference clock period. On the other hand, if the output of the BBPD 106 is a logic "0", the up-down accumulator 110 subtracts the value "−1" at each reference clock period. The up-down accumulator 110 receives an inverted reference clock 105 from an output of inverter 112. An output delay control word D_CTRW 117 from the up-down accumulator 110 is coupled to the slow buffers 102. The D_CTRW 117 controls whether to speed-up or slow-down propagation delay of the slow buffers 102.

As the reference clock 105 is applied to the slow buffers 102 and the fast buffers 104, the output rising clock edge of the chain of slow buffers 102 applied to the data input 107 of the bang-bang PD 106, and the output of the fast buffers 104 applied to trigger input 109 will have a different fixed delay relationship due to PVT variation during manufacture. The output 111 of the bang-bang PD 106 provides a polarity signal that will be logic low, "0" or negative polarity signal if the delay of the slow buffers 102 is slower than the fast buffers 104. In other words, the bang-bang PD provides a polarity signal based upon a phase difference between the slow buffer delay signal and the fast buffer delay signal. The logic low from output 111 is received at the first input 113 of the up-down accumulator 110. As the reference clock signal is propagated through the automated delay adjustment for VRTDC, a series of polarity signals of logic lows "0s" are received and causes the output delay control word D_CTRW to increase. In accordance to an embodiment of the present invention, the output delay control word D_CTRW is an eight bit digitalized value. For example, a series of "0s" cause the D_CTRW 117 to change from "8'b10000000" to "8'b10000001"\"8'b10000001" to "8'b10000010"\. The D_CTRW 117 received at the slow buffers 102 causes the propagation delay of the slow buffers 102 to speed up or time delay reduced. On the other hand, whenever the D_CTRW 117 decreases in value, the propagation delay of the slow buffers 102 is decreased.

For example, if the propagation delay for the slow buffers 102 are too fast compared to the fast buffers 104, the output 111 of the bang-bang PFD 106 will be a logic high, "1" or positive polarity signal. At the up-down accumulator 110, the logic high, "1" signal at the first input 113 and a "−1" value at the second input 115 causes the D_CTRW 117 to be reduced by minus one, which is applied to the slow buffer 102. The reduced value of D_CTRW 117 causes propagation delay of the slow buffers 102 to increase. As the ratio delay between the slow buffers 102 and fast buffers 104 becomes more constant, a series of repeating logic high, "1" and logic low, "0" signals will be received at the up-down accumulator 110 and the D_CTRW 117 applied to the slow buffer 102 will alternate between two values indicating a fixed ratio delay between the slow buffers 102 and fast buffers 104 has been achieved. Based on the plurality of repeating logic high and logic low signals, the locking detector 108 provides the calibration done signal 119 to indicate that the VRTDC is calibrated and adjusted for a fixed ratio delay between the slow buffers 102 and fast buffers 104.

Figure 2:
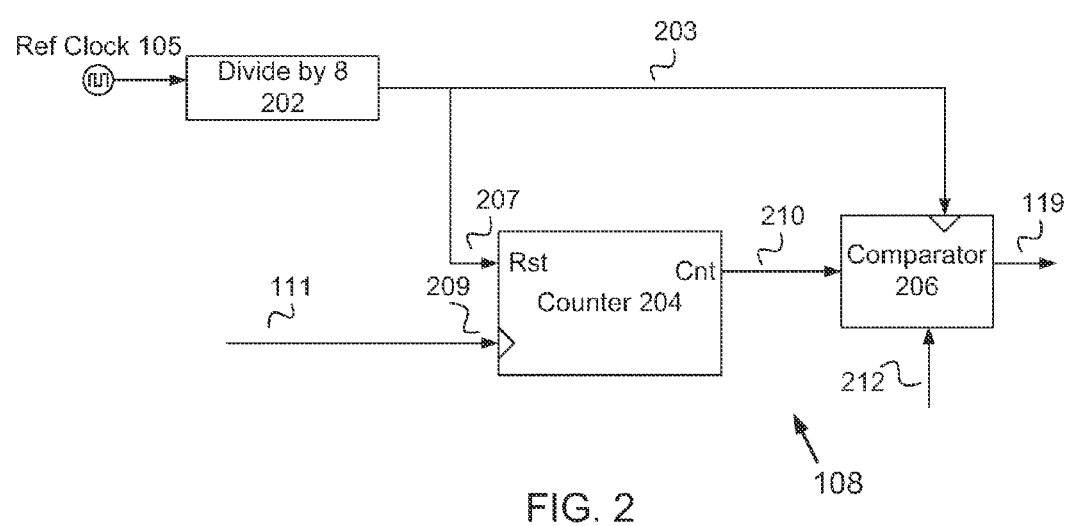
FIG. 2 illustrates a block diagram of the locking detector 108 in accordance with an embodiment of the present invention.

FIG. 2 illustrates a block diagram of the locking detector 108 in accordance with an embodiment of the present invention. Reference clock 105 is coupled to a divide by 8 counter 202. The divide by 8 counter 202 provides a divide by 8 clock signal 203 to a counter 204 and a comparator 206. The counter 204 receives the divide by 8 clock signal 203 at a reset input 207 and the output 111 of the bang-bang PFD at a clock input 209. The counter 204 provides a count output 210 to comparator 206. The comparator 206 also receives a window value 212 as another input. The window value 212 in accordance to an embodiment of the present invention is set to a value of "2". The comparator 206 provides the calibration done signal 119 as an output. In operation, the locking detector 108 receives a plurality of repeating logic high "1" and logic low "0" signals when a fixed ratio delay is achieved. In particular, counter 204 receives the plurality of repeating logic high and logic low signals and counts the number of transitions. Since the reset input 207 receives a divide by 8 clock signal 203 every eight clock cycles from the divide by 8 counter 202, a maximum count of 8 can be achieved at the count output 210 that is provided to the comparator 206. Given that the window value 212 is set to the value of 2, the comparator 206 compares the count output 210 with the window value 2 and provides the calibration done signal 199 when the count output 210 is greater than the window value 212 set to a value of "2". Accordingly, a window value 212 set to "2" indicates that there was at least two repeating cycles of logic high and logic low signals received from the bang-bang PFD 106 within 8 reference clock cycles. Other values beside "2" can be set for the window value 212 depending on system design preference.

Figure 3:
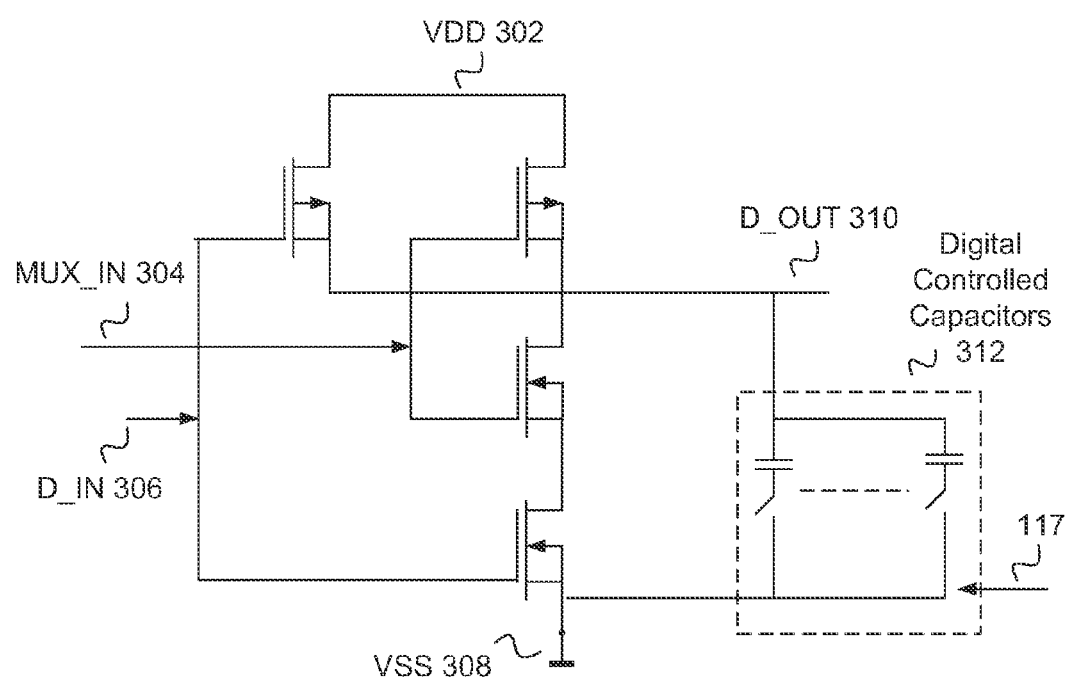
FIG. 3 illustrates a simplified circuit diagram for changing the propagation delay of buffers to achieve a fixed ratio gate delay between the slow and fast buffers.

FIG. 3 illustrates a simplified buffer circuit diagram for the Vernier delay line Ring TDC in accordance to an embodiment of the present invention. Although both the slow buffers and the fast buffers can be used to alter the propagation delay, slow buffers propagation delays are shown being altered to achieve the fixed delay ratio between fast buffers and slow buffers in accordance to an embodiment of the present invention. The circuit for changing the propagation delay of the slow buffers 102 includes a VDD 302 and VSS 308 connection between power and ground. MUX_IN 304 provides selection of the slow buffers 102. D_IN 306 provides a data in signal and D_OUT 310 provides a data out signal. A similar circuit is also provided for the changing the propagation delay of the fast buffers 104. Accordingly, depending on designer preference, instead of changing the propagation delay of the slow buffers 102, the propagation delay of the fast buffers 104 can be used to set the fixed ratio delay between the slow buffers 102 and the fast buffers 104. The propagation delay of the slow buffers 102 can be changed by altering an output capacitance of digital controlled capacitors 312 of the slow buffers 102. For example, if the propagation delay for the slow buffers 102 is too slow, the D_CTRW signal 117 reduces the output capacitance of the digital controlled capacitors 312 of the slow buffers 102 to increase the speed of the slow buffers 102. Similarly, if the propagation delay for the slow buffers 102 is too fast, the D_CTRW signal 117 increases the output capacitance of the digital controlled capacitors of the slow buffers 102 to lower the speed of the slow buffers 102.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A self-delay calibration Vernier delay TDC apparatus comprising:
    a voltage controlled slow buffer chain having an input coupled to a reference clock and an output coupled to a first input of a bang-bang phase detector ("BBPD") configured to provide a slow buffer delay signal;
    a fast buffer chain having an input coupled to the reference clock and an output coupled to a second input of the BBPD configured to provide a fast buffer delay signal;
    the BBPD configured to provide a polarity signal based upon a phase difference between the slow buffer delay signal and the fast buffer delay signal; and
    an accumulator having a first input coupled to a reference value, a second input coupled to the BBPD configured to receive the polarity signal, an output coupled to the voltage controlled slow buffer chain, and a clock input coupled to the reference clock wherein the accumulator responsive to the polarity signal from the BBPD is configured to provide a delay control signal to the voltage controlled slow buffer chain to change propagation delay of the slow buffer delay signal.

2. The TDC apparatus of claim 1, wherein the delay control signal is an eight bit control word.

3. The TDC apparatus of claim 2, wherein the polarity signal increments or decrements the control word.

4. The TDC apparatus of claim 3, wherein a negative polarity signal increments the control word and reduces propagation delay of the slow buffer chain.

5. The TDC apparatus of claim 3, wherein a positive polarity signal decrements the control word and increases propagation delay of the fast buffer chain.

6. The TDC apparatus of claim 1 further comprising an inverter coupled between the reference clock and the clock input of the accumulator.

7. The TDC apparatus of claim 1, wherein the reference value is a positive integer value.

8. The TDC apparatus of claim 1 further comprising a locking detector having a clock input coupled to the reference clock and an input coupled to an output of the BBPD configured to receive the polarity signal and provide a calibration done signal based upon a plurality of consecutive positive and negative polarity signals.

9. The TDC apparatus of claim 8, wherein the calibration done signal indicates a fixed ratio delay between the slow buffer chain and the fast buffer chain.

10. The TDC apparatus of claim 8, wherein the fixed ratio delay between the fast buffer chain and the slow buffer chain is 2.

* * * * *